| (12) | United States Patent | (10) Patent No.: | US 8,274,591 B2 |
|---|---|---|---|
| | Okada | (45) Date of Patent: | Sep. 25, 2012 |

(54) ELECTROMAGNETIC WAVE DETECTION ELEMENT

(75) Inventor: Yoshihiro Okada, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 398 days.

(21) Appl. No.: 12/469,698

(22) Filed: May 21, 2009

(65) Prior Publication Data

US 2009/0290055 A1 Nov. 26, 2009

(30) Foreign Application Priority Data

May 22, 2008 (JP) .................................. 2008-134618

(51) Int. Cl.
*H04N 3/14* (2006.01)
*H04N 5/335* (2011.01)
(52) U.S. Cl. .......................... 348/308; 348/294; 348/302
(58) Field of Classification Search .................. 348/294, 348/302, 308
See application file for complete search history.

(56) References Cited

U.S. PATENT DOCUMENTS

| 2004/0252215 A1* | 12/2004 | Mori | 348/308 |
| 2006/0001751 A1* | 1/2006 | Abe et al. | 348/300 |
| 2009/0194673 A1* | 8/2009 | Shoji | 250/214 A |

FOREIGN PATENT DOCUMENTS

| JP | 2003-264273 | | 9/2003 |
| WO | WO 2007/105905 | * | 9/2007 |

* cited by examiner

*Primary Examiner* — Jordan Schwartz
(74) *Attorney, Agent, or Firm* — SOLARIS Intellectual Property Group. PLLC

(57) ABSTRACT

The present invention provides an electromagnetic wave detection element that can raise the speed of image read-out. Scan lines are each disposed to plural pixel lines for each of the pixel lines in a row direction of plural pixels disposed in a matrix array, and switches each TFT switch provided to respective pixels in the plural pixel lines by the respective scan lines. Plural signal lines are each disposed to each of the pixel lines in the column direction of the matrix array. In each of the pixel lines in the column direction, the respective signal line is connected to a different TFT switch from the TFT switches that are connected to the same respective scan line, and the charge accumulated in storage capacitors is read out through each of the signal lines according to the state of the TFT switches.

13 Claims, 14 Drawing Sheets

ELECTROMAGNETIC WAVE DETECTION ELEMENT

CROSS-REFERENCE TO RELATED APPLICATION

This application claims priority under 35 USC 119 from Japanese Patent Application No. 2008-134618, the disclosure of which is incorporated by reference herein.

BACKGROUND OF THE INVENTION

1. Field of the Invention

The present invention relates to an electromagnetic wave detection element. The present invention particularly relates to an electromagnetic wave detection element that accumulates charge generated by irradiating electromagnetic waves for detection onto plural pixels disposed in a matrix, and detects the accumulated charge amounts of charges as information representing an image.

2. Description of the Related Art

Radiation electromagnetic wave detection elements such as FPDs (flat panel detectors), in which an X-ray sensitive layer is disposed on a TFT (thin film transistor) active matrix substrate and that can convert X-ray information directly into digital data, and the like, have been put into practice in recent years. Such electromagnetic wave detection elements are used in radiographic imaging apparatuses. As compared with a conventional imaging plate, an image can be confirmed immediately at an FPD. Further, the FPD has the advantage that video images as well can be confirmed. Therefore, the popularization of FPDs has advanced rapidly.

Various types of electromagnetic wave detection elements are proposed. For example, there is a direct-conversion-type electromagnetic wave detection element that converts radiation directly into charges in a semiconductor layer, and accumulates the charges. Moreover, there is an indirect-conversion-type electromagnetic wave detection element that once converts radiation into light at a scintillator of CsI:Tl, GOS (Gd2O2S:Tb), or the like, and, at semiconductor layer, converts the converted light into charges and accumulates the charges.

In electromagnetic wave detection elements, for example, plural scan lines and plural signal lines are disposed so as to intersect with each other, and charge storage capacitors and TFT switches are provided at each of the intersections between the scan lines and the signal lines. Further, in electromagnetic wave detection elements, a semiconductor layer is also provided to cover the charge storage capacitors, and the TFT switches are provided at each of the intersections. When radiographic imaging apparatuses using such electromagnetic wave detection elements capture radiographic images, during irradiation of X-rays, an OFF signal is output to each of the scan lines, and each of the TFT switches is switched OFF. Accordingly, the charges generated in the semiconductor layer are accumulated in each of the charge storage capacitors. Then, when reading out an image from the radiographic imaging apparatus, an ON signal is output to each scan line one at a time in sequence, the charges accumulated at each of the charge storage capacitors is read out as an electrical signal, and the read-out electrical signal is converted into digital data. The radiographic imaging apparatus obtains radiographic images according to the above procedures.

However, when radiographic imaging apparatuses attempt to read out radiographic images successively from the electromagnetic wave detection elements in order to obtain a video image, the number of frames of radiographic image read-out per second (the frame rate) is large. Further, in a radiographic imaging apparatus, the scanning time for outputting an ON signal to a single scanning line, and for reading out the electrical signal, also gets smaller as the number of scan lines of the electromagnetic wave detection element increases.

The scan time 1 H can be derived according to expression (1) below, where the frame rate is denoted by FR, and the number of scan lines of the electromagnetic wave detection element is denoted by Gn.

$$1H = 1/FR/Gn \quad (1)$$

For example, when the frame rate FR is 60, and the number of scan lines Gn is 1000 lines, then the scan time 1 H is 16.7 μs.

If a TFT active matrix substrate is used as a liquid crystal display (LCD), the scan time 1 H can be used entirely as time for reading in data. This means that 16.7 μs is a sufficient time.

However, if a TFT active matrix substrate is used as a detection element that captures an image, then in order to perform noise reduction (namely, when used as a detection element for medical radiographic image capture that requires low-noise imaging), not all of the scan time 1 H can be allocated to a charge read-out period, since after amplifying the electrical signal of charge that has been accumulated in each of the charge storage capacitors, and is converted into digital data in an A/D (analogue/digital) conversion unit, and correction processing and the like is performed to the converted digital data. This makes it difficult to image video images of high frame rate.

Japanese Patent Application Laid-Open (JP-A) No. 2003-2642273 (document 1) discloses a technology to address this issue, enabling imaging of video images of high frame rate. In the technology disclosed in document 1, the image receiving face of the electromagnetic wave detection elements is divided into plural pixel areas, read-out devices are provided for each of the pixel areas, and image read-out is performed for each of the pixel areas.

However, in the technology of document 1, the image receiving face is divided into plural pixel areas and pixels are read out in series from each of the pixel areas. Thus, although the techniques disclosed in Document 1 may increase the speed of pixel read-out overall, they do not increase the speed of pixel read-out for a single pixel area.

SUMMARY OF THE INVENTION

The present invention provides an electromagnetic wave detection element that can raise the speed of reading out the pixels.

A first aspect of the present invention is an electromagnetic wave detection element including: a plurality of pixels disposed in a matrix, along a first direction and a second direction intersecting with the first direction, each pixel accumulating charges generated by irradiation of electromagnetic waves, and having a switching element for reading out the accumulated charges; scan lines that switch each of the switching elements, each scan line being disposed corresponding to a plurality of pixel lines in the first direction, and connected to each of the switching elements provided to the respective pixels in the plurality of pixel lines; and signal lines, in which a plurality of signal lines are disposed corresponding to each of the pixel lines in the second direction, each signal line of signal lines disposed corresponding to the same pixel line being connected to a different switching element of switching elements connected to the same scan line, and charge accumulated in the pixels flowing through the signal lines according to the switching state of the switching elements.

The electromagnetic wave detection element of the first aspect of the present invention accumulates charges generated by irradiation of electromagnetic waves which are subjects for detection. In the electromagnetic wave detection element of the first aspect of the present invention, plural pixels provided with switching elements for reading out the accumulated charges are disposed in a matrix, along a first direction and a second direction intersecting with the first direction.

In the first aspect, scan lines, that switches each of the switching elements, are each disposed to plural pixel lines in the first direction of the plural pixels disposed in the matrix array, and are each connected to each of the switching elements provided to the respective pixels in the plural pixel lines. The signal lines, that flows there through the charges accumulated in the pixels according to the switching state of the switching elements, are each disposed to each of the pixel lines in the second direction of the matrix array, and are each connected to a different switching element from the switching elements that are connected to the same respective scan line in each of the pixel lines in the second direction.

According to the first aspect, switching elements for the pixels in the pixel lines in the first direction can be switched by plural pixel lines at a time in the above manner, and the charge accumulated in each of the pixel can be read out at plural lines at a time. Therefore, the electromagnetic wave detection element of the first aspect can consequently raise the image read-out speed.

A second aspect of the present invention is an electromagnetic wave detection element including: a plurality of pixels disposed in a matrix, along a first direction and a second direction intersecting with the first direction, each pixel accumulating charges generated by irradiation of electromagnetic waves, and having a switching element for reading out the accumulated charges; scan lines that switch each of the switching elements, one scan line being disposed corresponding to each pixel line in the first direction, the scan lines being connected to each of the switching elements provided to each pixel in the corresponding pixel line; connection lines, each electrically connecting a specific number of the scan lines; signal lines, in which a plurality of signal lines are disposed corresponding to each of the pixel lines in the second direction, each signal line of signal lines disposed corresponding to the same pixel line being connected to a different switching element of switching elements connected to the specific number of scan lines electrically connected by the same connection line, and charge accumulated in the pixels flowing through the signal lines according to the switching state of the switching elements.

In the electromagnetic wave detection element of the second aspect, pixels that accumulate charge generated by irradiation with electromagnetic waves are provided with switching elements for reading out the accumulate charge, and the pixels are disposed in a matrix shape, along a first direction and a second direction intersecting with the first direction.

Scan lines, that switches the switching elements, are each disposed to each of the pixel lines in the first direction of the plural pixels disposed in the matrix array, and are each connected to each of the switching elements provided to each the pixels in the respective pixel line. A specific number of these scan lines are electrically connected together by respective connection lines. Plural signal lines are also disposed to each of the pixel lines in the intersecting direction of the matrix array. The respective signal lines for each of the pixel lines in the second direction are connected to a different switching element from the switching elements that are connected to the specific number of respective scan lines that have been electrically connected together by the same connection line. Further, the signal lines flows there through the charges accumulated in the pixels according to the switching state of the switching elements.

Accordingly, the second aspect can switch the switching elements of each pixel of the pixel lines in the first direction, by plural lines of switch elements at a time, since a specific number of scan lines are electrically connected via the connection lines. Further, the second aspect can read out the charges accumulated in each pixel, from plural pixel lines at a time, via the signal lines. Therefore, the second aspect of the present invention can consequently raise the pixel read-out speed.

In a third aspect of the present invention, in the above first aspect, the scan lines may be provided such that one scan line is provided for each two pixel lines in the first direction, disposed between the two respective pixel lines, and each of the switching elements may be provided at the scan line side of the corresponding pixel.

In a fourth aspect of the present invention, in the above aspects, two of the signal lines may be provided for each of the pixel lines in the second direction, with one of the two signal lines disposed so as to pass through a central region of the pixels.

In a fifth aspect of the present invention, in the above aspects, the signal lines may be disposed with an even spacing therebetween.

In a sixth aspect of the present invention, in the above aspects, the pixels may be further provided with a collecting electrode that collects the generated charges, and the collecting electrode may be provided with a slit at a position where the signal line is disposed.

In a seventh aspect of the present invention, in the above sixth aspect, the pixels may be further provided with a charge accumulation portion that accumulates the collected charges, and the charge accumulation portion and the switching element may be electrically connected via the collecting electrode.

In an eighth aspect of the present invention, in the above seventh aspect, the charge accumulation portion may be configured with two facing electrodes, and may further include accumulation capacitor lines, each disposed to a plurality of pixel lines in the first direction, each connected to one of the electrodes of the charge accumulation portion provided to each of the pixels of the plurality of pixel lines.

In a ninth aspect of the present invention, in the above seventh aspect, the charge accumulation portion may be configured with two facing electrodes, and may further include accumulation capacitor lines, each disposed corresponding to each of the pixel lines in the second direction alongside the signal lines, and each connected to one of the electrodes of the charge accumulation portion provided to each of the pixels in each of the pixel lines in the second direction.

In a tenth aspect of the present invention, in the above eighth aspect, the signal lines and the accumulation capacitor lines may be formed in different wiring layers.

Thereby, according to the present invention, the speed for reading out the pixels can be increased.

BRIEF DESCRIPTION OF THE DRAWINGS

Exemplary embodiments of the present invention will be described in detail based on the following figures, wherein.

DETAILED DESCRIPTION OF THE INVENTION

Explanation will now be given of exemplary embodiments of the present invention, with reference to the figures. A case is explained below in which the present invention is applied to a radiographic imaging apparatus 100 utilizing direct-conversion-type electromagnetic wave detection elements 10.

First Exemplary Embodiment

Figure 1:
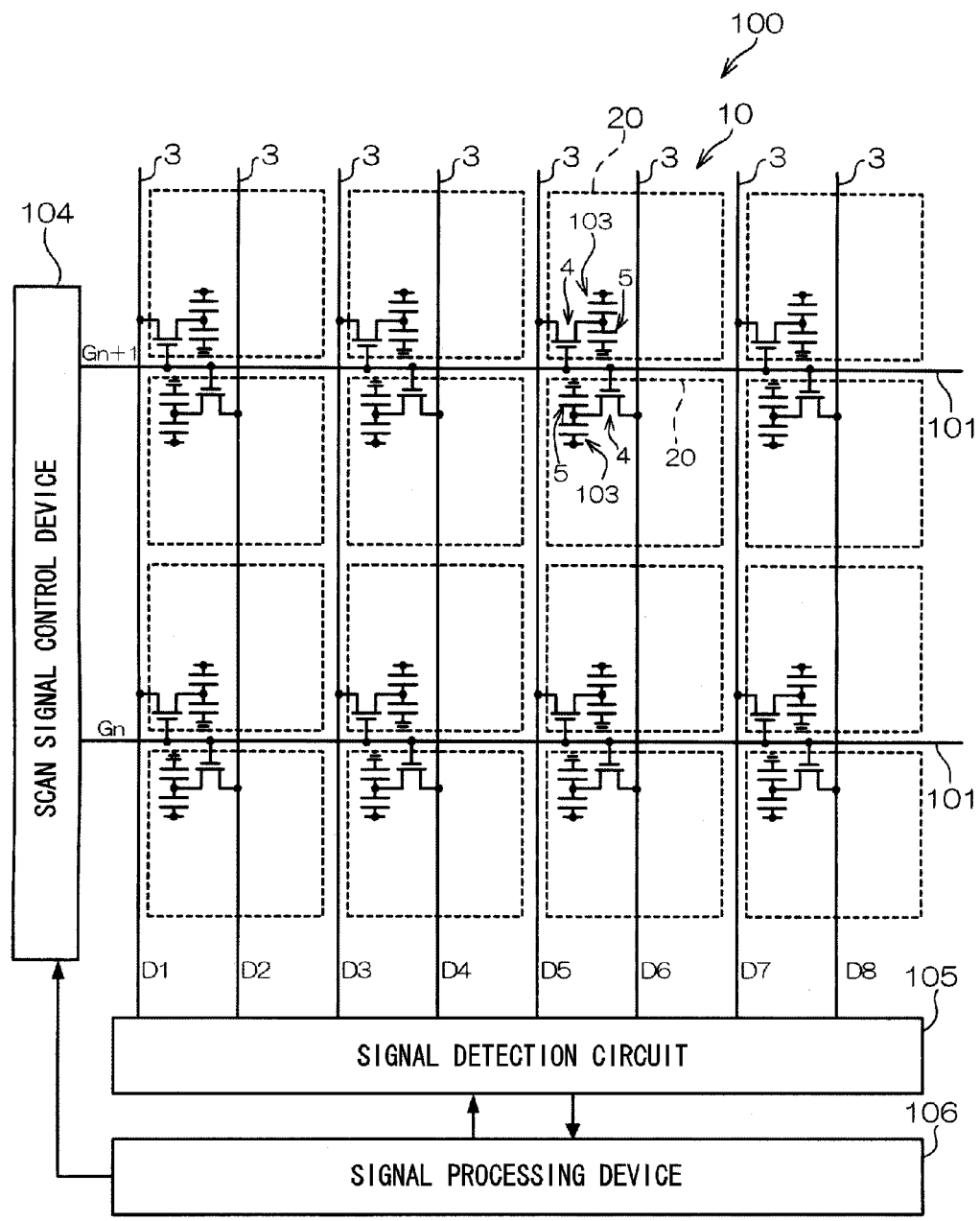
FIG. 1 is a schematic diagram showing an overall configuration of a radiographic imaging apparatus according to a first to a third exemplary embodiment.

An overall configuration of the radiographic imaging apparatus 100 according to the first exemplary embodiment is shown in FIG. 1.

An electromagnetic wave detection element 10 is provided to the radiographic imaging apparatus 100 according to the first exemplary embodiment, as shown in FIG. 1.

The electromagnetic wave detection element 10 is provided with an upper electrode, a semiconductor layer, and a lower electrode. Plural pixels 20, each including a sensor portion 103, a charge storage capacitor 5, and a TFT switch 4, are arrayed in a matrix layout along a given direction (the across direction in FIG. 1, referred to as "the row direction" below) and an direction intersecting with the given direction (the vertical direction in FIG. 1, referred to as "the column direction" below). The sensor portions 103 generate charges on receipt of irradiated radiation thereon. The charge storage capacitors 5 accumulate the charges generated in the sensor portions 103. The TFT switches 4 read out the charges that has accumulated in the charge storage capacitors 5. One of the electrodes of each of the charge storage capacitors 5 is grounded through a later described storage capacitor line 102 (see FIG. 2) and is set at ground voltage level. One of the electrodes of each of the charge storage capacitors 5 in FIG. 1, FIG. 7, FIG. 9, FIG. 11 and FIG. 13 is individually connected to the ground.

In the electromagnetic wave detection element 10, scan lines 101 are provided for each of the pixel lines in the row direction of the matrix array of plural pixels 20. One scan line 101 is provided for two pixel lines, and is provided between the two pixel lines. Respective TFT switches 4 are provided at the scan line 101 side of each pixel 20. Each of the scan lines 101 is connected to each of the TFT switches 4 provided to each of the pixels 20 in the respective two lines of pixels, and switches the TFT switches 4.

In the electromagnetic wave detection element 10, for each of the pixel lines disposed along the column direction of the matrix array of plural arrayed pixels 20, two signal lines 3 are provided for each pixel line and disposed with an even spacing therebetween. In the electromagnetic wave detection element 10 according to the first exemplary embodiment, the signal lines 3 are disposed such that, for each of the pixel lines in the column direction, one of the two signal lines 3 passes through a central portion of the pixels 20. Each of the signal lines 3, for each of the pixel lines in the column direction, is connected to a different TFT switch 4 from the pairs of TFT switches 4 that are connected to the same scan line 101. Charges accumulated in the charge storage capacitor 5 flows through the signal lines 3 according to the switching state of the TFT switches 4. A signal detection circuit 105 that detects an electrical signal output flowing through each of the signal lines 3 is connected to each of the signal lines 3. A scan signal controller 104 that outputs a control signal for switching the TFT switches 4 of each scan line 101 ON/OFF is connected to each of the scan lines 101.

The signal detection circuit 105 includes an internal amplifier that amplifiers the input electrical signal, for each of the signal lines 3. The amount of charges that has been accumulated in each of the charge storage capacitors 5 is thereby detected as information for each of the pixels configuring an image.

A signal processor 106 is connected to the signal detection circuit 105 and to the scan signal controller 104. The signal processor 106 processes a specific processing to the electrical signals detected in the signal detection circuit 105, such as noise removal and the like. The signal processor 106 also outputs a control signal that indicates the signal detection timing, to the signal detection circuit 105, and outputs a control signal that indicates the scan signal output timing, to the scan signal controller 104.

Figure 2:
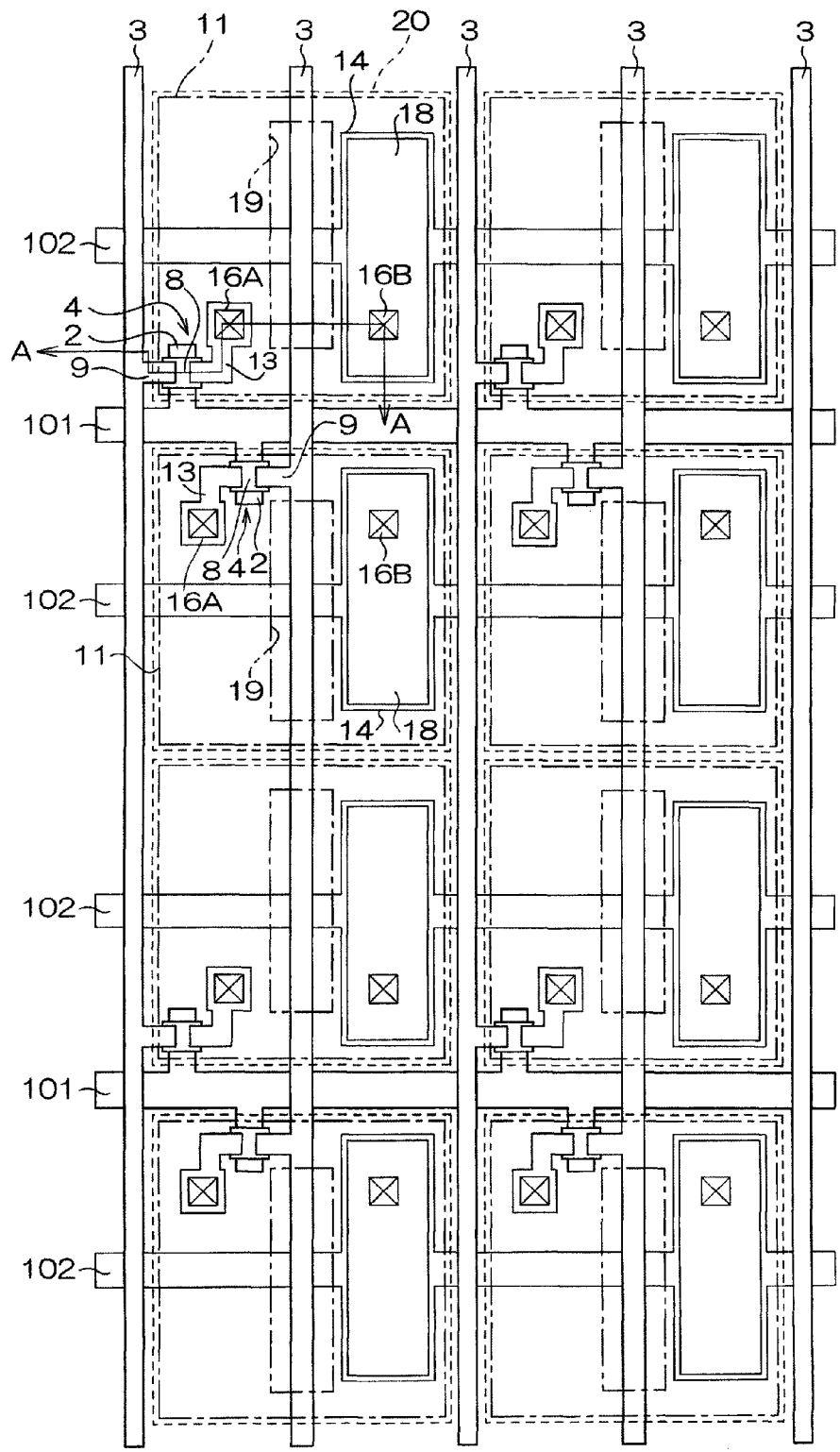
FIG. 2 is a plan view showing a configuration of an electromagnetic wave detection element according to the first exemplary embodiment.

Explanation will now be given of further details of the electromagnetic wave detection element 10 according to the first exemplary embodiment, with reference to FIG. 2 and FIG. 3. Note that FIG. 2 shows a plan view showing a structure of an electromagnetic wave detection element 10 according to the first exemplary embodiment. A cross-sectional view along line A-A of FIG. 2 is shown in FIG. 3.

Figure 3:
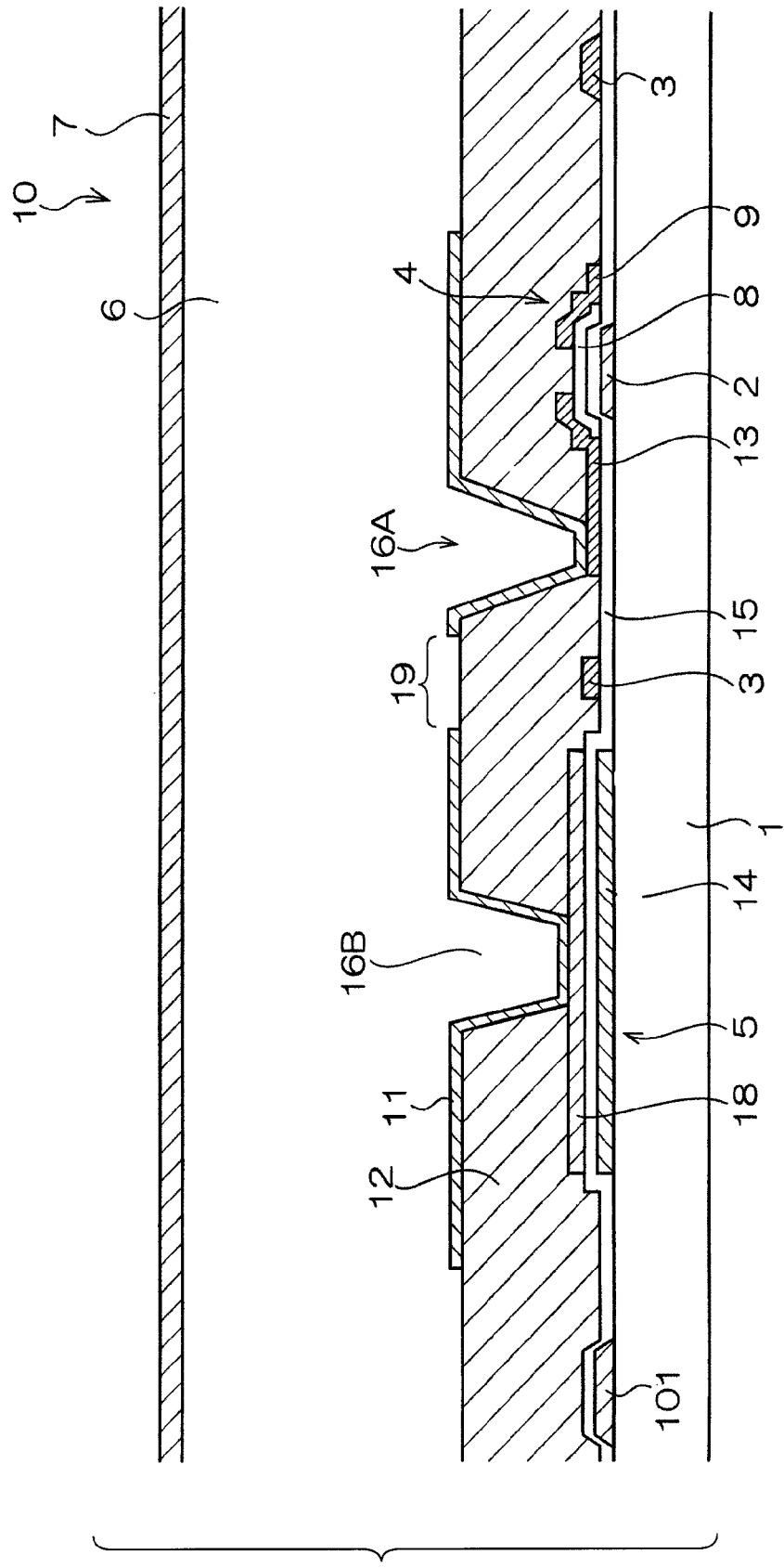
FIG. 3 is a cross-sectional view showing an electromagnetic wave detection element according to the first exemplary embodiment.

The electromagnetic wave detection element 10 is configured, as shown in FIG. 3, to include on an insulating substrate 1 of alkali-free glass or the like: scan lines 101; storage capacitor lower electrodes 14; gate electrodes 2; and storage capacitor lines 102 (see FIG. 2). The storage capacitor lines 102 are connected to the scan lines 101. The storage capacitor lower electrodes 14 are connected to the storage capacitor lines 102. The wiring layer at which the scan lines 101 and the gate electrodes 2 are formed (hereinafter, this wiring layer is also called a "first signal wiring layer") is formed by using Al or Cu, or a layered film formed including Al or Cu. However, the materials of the wiring layer are not limited to these.

An insulating film 15 is formed on the entire surface on the first signal wiring layer. The region of the insulating film 15 that is positioned above the gate electrode 2 works as a gate insulating film of the TFT switch 4. The insulating film 15 is formed of, for example, SiNX or the like. The insulating film 15 is formed by, for example, CVD (Chemical Vapor Deposition).

Semiconductor active layers 8 are formed at positions corresponding to the gate electrodes 2 on the insulating film 15. The semiconductor active layer 8 is the channel portion of the TFT switch 4, and is formed from, for example, an amorphous silicon film.

A source electrode 9 and a drain electrode 13 are formed at the upper layer of the above-described layers. Together with the source electrodes 9 and the drain electrodes 13, the signal lines 3 are formed at the wiring layer (referred to below as the "second wiring layer") at which the source electrodes 9 and the drain electrodes 13 are formed. Storage capacitor upper electrodes 18 are also formed in the second signal wiring layer, above the insulating film 15 at positions corresponding to the storage capacitor lower electrodes 14. The source electrodes 9 are connected to the signal lines 3 (see FIG. 2). Note that, the TFT switches 4 become opposite polarity to the source electrodes 9 and the drain electrodes 13 due to the polarity of the charge that has been accumulated in the storage capacitor line 102. The second wiring layer in which the source electrodes 9, drain electrodes 13, storage capacitor upper electrodes 18, and signal lines 3 formed, is formed by using Al or Cu, or a layered film formed including Al or Cu. However, the materials of the wiring layer are not limited to these.

A contact layer (non-illustrated) is formed between the source electrodes 9 and the drain electrodes 13, and the semiconductor active layer 8. This contact layer is formed from an impurity doped semiconductor, such as impurity doped amorphous silicon etc. In the electromagnetic wave detection element 10 according to the first exemplary embodiment, the TFT switches 4 are configured by the gate electrodes 2, the insulating film 15, the source electrodes 9, the drain electrodes 13, and a semiconductor layer 6. Further, in the electromagnetic wave detection element 10 according to the first exemplary embodiment, the charge storage capacitors 5 are configured by the storage capacitor lower electrodes 14, insulating film 15 and the storage capacitor upper electrodes 18.

In the electromagnetic wave detection element 10 according to the first exemplary embodiment, for each of the pixels 20, the TFT switch 4 and the charge storage capacitor 5 are disposed in two regions that are separated by the signal line 3 that passes through a central region of the pixel 20. In each of the pixels 20 of the electromagnetic wave detection element 10 according to the first exemplary embodiment, both the region in which the TFT switch 4 is disposed and the region in which the charge storage capacitor 5 is disposed are the same.

An interlayer insulating film 12 is formed covering the second signal wiring layer, over substantially the entire surface (substantially the whole region) where the pixels 20 are provided on the substrate 1. The interlayer insulating film 12 is formed from a photosensitive organic material, such as an acrylic resin or the like. The thickness of the interlayer insulating film 12 is 1 to 4 µm, and the relative permittivity thereof is 2 to 4. In the electromagnetic wave detecting element 10 relating to the present exemplary embodiment, the capacity between the metals that are disposed at the upper layer and the lower layer of the interlayer insulating film 12 is kept low by the interlayer insulating film 12. Further, generally, a material such as the above also functions as a flattening film, and also has the effect of flattening the steps of the lower layer. The shapes of semiconductor layer 6 that are disposed at the upper layer are flattened by the interlayer insulating film 12. Therefore, a decrease in the absorption efficiency due to unevenness of the semiconductor layer 6, and an increase in leak current can be suppressed. Contact holes 16A, 16B respectively are formed in the interlayer insulating film 12 at positions opposing the drain electrodes 13 and at positions opposing the storage capacitor upper electrodes 18.

A lower electrode 11 of the sensor portion 103 is formed in each of the pixels 20, so as to cover the pixel region while filling-in the contact holes 16A, 16B. The lower electrodes 11 are formed from an amorphous transparent conducting oxide film (such as ITO), and are connected to the drain electrodes 13 through the contact holes 16A. The lower electrodes 11 are also connected to the storage capacitor upper electrodes 18 through the contact holes 16B. The charge storage capacitors 5 and the TFT switches 4 are thereby electrically connected through the lower electrodes 11. Slits 19 are also provided in the lower electrode 11 at positions where the signal lines 3 are disposed.

The semiconductor layer 6 is uniformly formed on the lower electrode 11 over substantially the entire surface of a pixel region in which pixels are provided on the insulative substrate 1. Electromagnetic waves such as X-rays or the like are irradiated at the semiconductor layer 6. Accordingly, the semiconductor layer 6 generates charges (electrons and holes) thereinside. That is, the semiconductor layer 6 features conductivity for electromagnetic waves and converts image information in the X-rays to charge information. The semiconductor layer 6 is formed of, for example, a-Se (amorphous selenium), of which selenium is the principal component. Here, the meaning of the term principal component is the inclusion of a content of at least 50%.

An upper electrode 7 is formed on the semiconductor layer 6. A bias power source (non-illustrated), is connected to the upper electrode 7. A bias voltage is provided to the upper electrode 7 from the bias power source.

Explanation will now be given of the principles of operation of the radiographic imaging apparatus 100 according to the first exemplary embodiment.

In a state in which a bias voltage is applied between the upper electrode 7 and the storage capacitor lower electrode 14, when X-rays are irradiated at the semiconductor layer 6, charges (electron-hole pairs) are generated inside the semiconductor layer 6.

The semiconductor layer 6 and the charge storage capacitor 5 are constituted to be electrically connected in series. Therefore, electrons generated in the semiconductor layer 6 migrate to a positive (plus) electrode side and holes migrate to a negative (minus) electrode side. During image detection, an OFF signal is output from the scan signal controller 104 to all of the scan lines 101, and a negative bias is applied to the gate electrodes 2 of the TFT switches 4. Each of the TFT switches 4 are thereby held in the OFF state. As a result, electrons that are generated in the semiconductor layer 6 are collected by the lower electrode 11, and are accumulated at the charge storage capacitor 5.

During image read out, an ON signal is output from the scan signal controller 104 in sequence to each of the scan lines 101. The ON signal (+10 to 20V) is applied in sequence through the scan lines 101 to the gate electrodes 2 of the TFT switches 4. The TFT switch 4 of each pixel 20 in the matrix array of plural pixels 20 arrayed in the column direction are thereby switched ON in sequence at two pixel lines at a time. An electrical signal according to the amount of charge that has accumulated in the charge storage capacitor 5 of each of the pixels 20, thereby flows out in sequence two pixel lines at a time through the signal lines 3.

In the electromagnetic wave detection element 10 according to the first exemplary embodiment, there are two signal lines 3 provided for each respective pixel line in the row direction. Also, for each of the pixel lines in the column direction, the respective two signal lines 3 are connected to different TFT switches 4 from the TFT switches 4 that are connected to the same given scan line 101. Consequently, the electrical signals flowing out from the pixels 20 at two pixel lines at a time each flow out through different signal lines 3.

The signal detection circuit 105 detects, as information for each pixel in two lines worth configuring an image, the amount of charges accumulated in the charge storage capacitor 5 of each of the sensor portions 103, based on the electrical signal that has flowed in each of the signal lines 3. Image information is thereby obtained representing the image caused by the X-rays irradiated onto the electromagnetic wave detection element 10.

The first exemplary embodiment can increase the image read-out speed by reading out the charges that has been accumulated in the charge storage capacitor 5 of each pixels 20 in this manner of two pixel lines at a time (in comparison to cases where read-out is one pixel line at a time). Consequently scan time can be made twice that when reading out one line at a time. The first exemplary embodiment therefore enables imaging at the high frame rates of video images.

In the first exemplary embodiment, there is also one scan line 101 provided for each two lines of pixels. Therefore, the first exemplary embodiment can reduce the number of intersection locations of the scan lines 101 for a single signal line 3, and the line capacity of each signal line 3 can be made small. The first exemplary embodiment can therefore reduce the noise generated in the signal line 3. The first exemplary embodiment can also increase the size of the pixels 20 by reducing the number of scan lines 101 provided.

In the first exemplary embodiment the signal lines 3 are also provided with an even spacing interval between each other. This consequently enables a reduction in the parasitic capacitance generated in each given signal line 3 to another signal line 3.

In the first exemplary embodiment, slits 19 are provided at the positions where the signal lines 3, of the lower electrode 11 that collects the charge generated in the semiconductor layer 6, are disposed. Therefore, the first exemplary embodiment can consequently reduce the parasitic capacitance generated between the signal lines 3 and the lower electrode 11. Accordingly, the first exemplary embodiment can suppress the difference of the line capacitance of each of the signal lines 3.

In the first exemplary embodiment, for each of the pixel lines in the column direction, the region in which the TFT switch 4 is provided and the region in which the charge storage capacitor 5 is provided, for each of the pixels 20, are in the same region. Therefore, the line capacitance of even numbered and odd numbered signal lines 3 are substantially the same in the first exemplary embodiment.

Also, in the first exemplary embodiment, the charge storage capacitor 5 and the TFT switch 4 in the pixels 20 are electrically connected through the lower electrode 11. Therefore, in the first exemplary embodiment, a separate line for connecting the charge storage capacitor 5 to the TFT switch 4 is not required to be formed.

Second Exemplary Embodiment

The configuration of the radiographic imaging apparatus 100 according to a second exemplary embodiment is the same as that of the above first exemplary embodiment (see FIG. 1). Therefore, the explanation of the configuration will be omitted.

Figure 4:
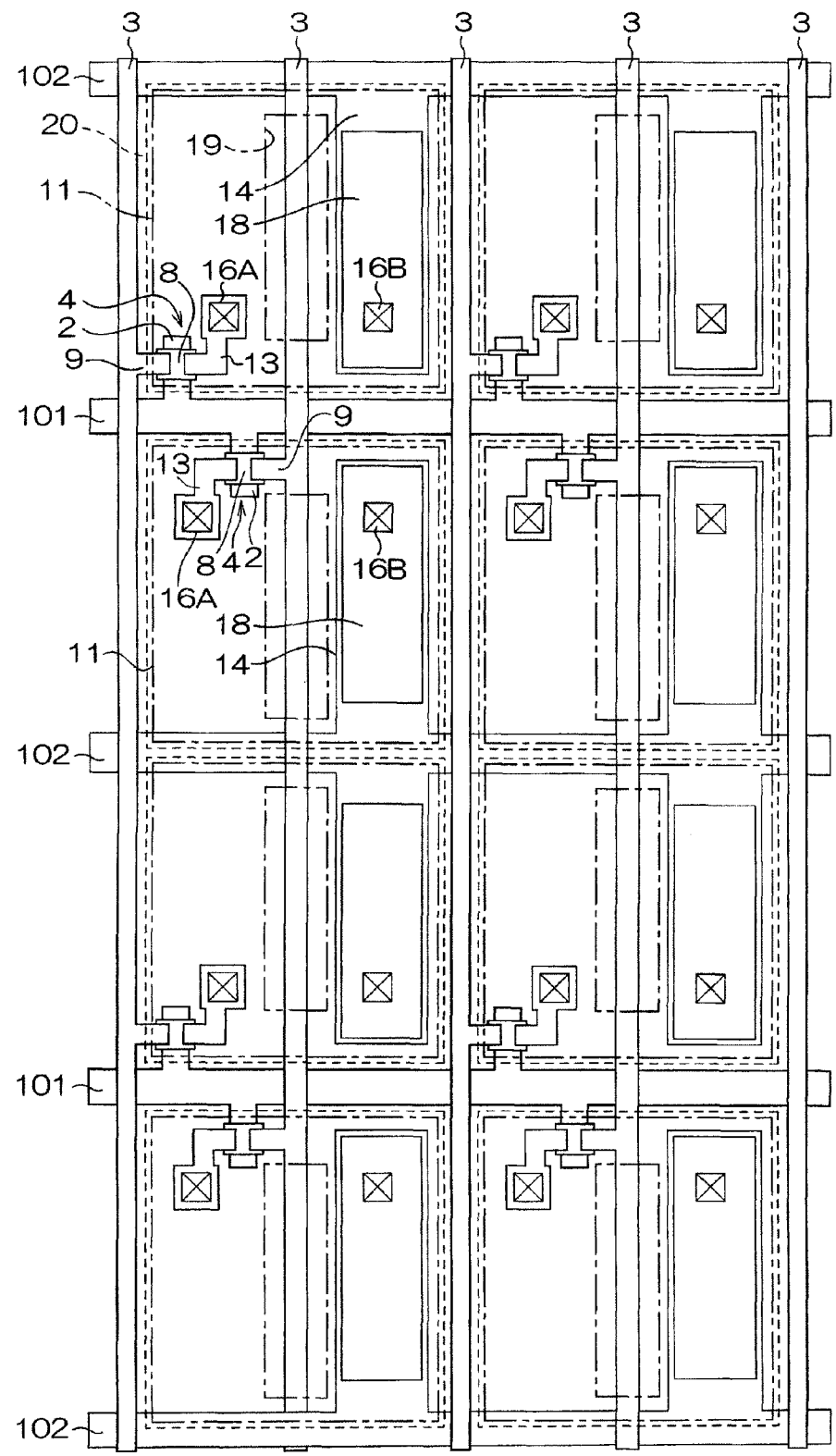
FIG. 4 is a plan view showing a configuration of an electromagnetic wave detection element according to a second exemplary embodiment.

FIG. 4 shows a plan view showing a structure of an electromagnetic wave detection element 10 according to the second exemplary embodiment. Note that, similar parts of the configuration to that of the first exemplary embodiment are allocated with the same reference numerals, and explanation thereof is omitted.

In the electromagnetic wave detection element 10, a storage capacitor line 102 is provided to each two lines of pixels in the column direction of the matrix array, each of the storage capacitor lines 102 being disposed between the two pixel lines, so as to alternate with the scan lines 101. Each of the storage capacitor lines 102 is connected to the storage capacitor lower electrode 14 of the charge storage capacitor 5 provided to each of the pixels 20 in the two pixel lines.

In the second exemplary embodiment, by providing one storage capacitor line 102 to each two pixel lines, the number of intersections of the signal lines 3 with the storage capacitor lines 102 can be reduced. Therefore, in the second exemplary embodiment, the line capacitance of the signal lines 3 can be reduced.

According to the second exemplary embodiment, the size of the pixels 20 can also be increased by reducing the number of storage capacitor lines 102.

Third Exemplary Embodiment

The configuration of the radiographic imaging apparatus 100 according to a third exemplary embodiment is the same as that of the above first exemplary embodiment (see FIG. 1). Explanation of the configuration will therefore be omitted.

Figure 5:
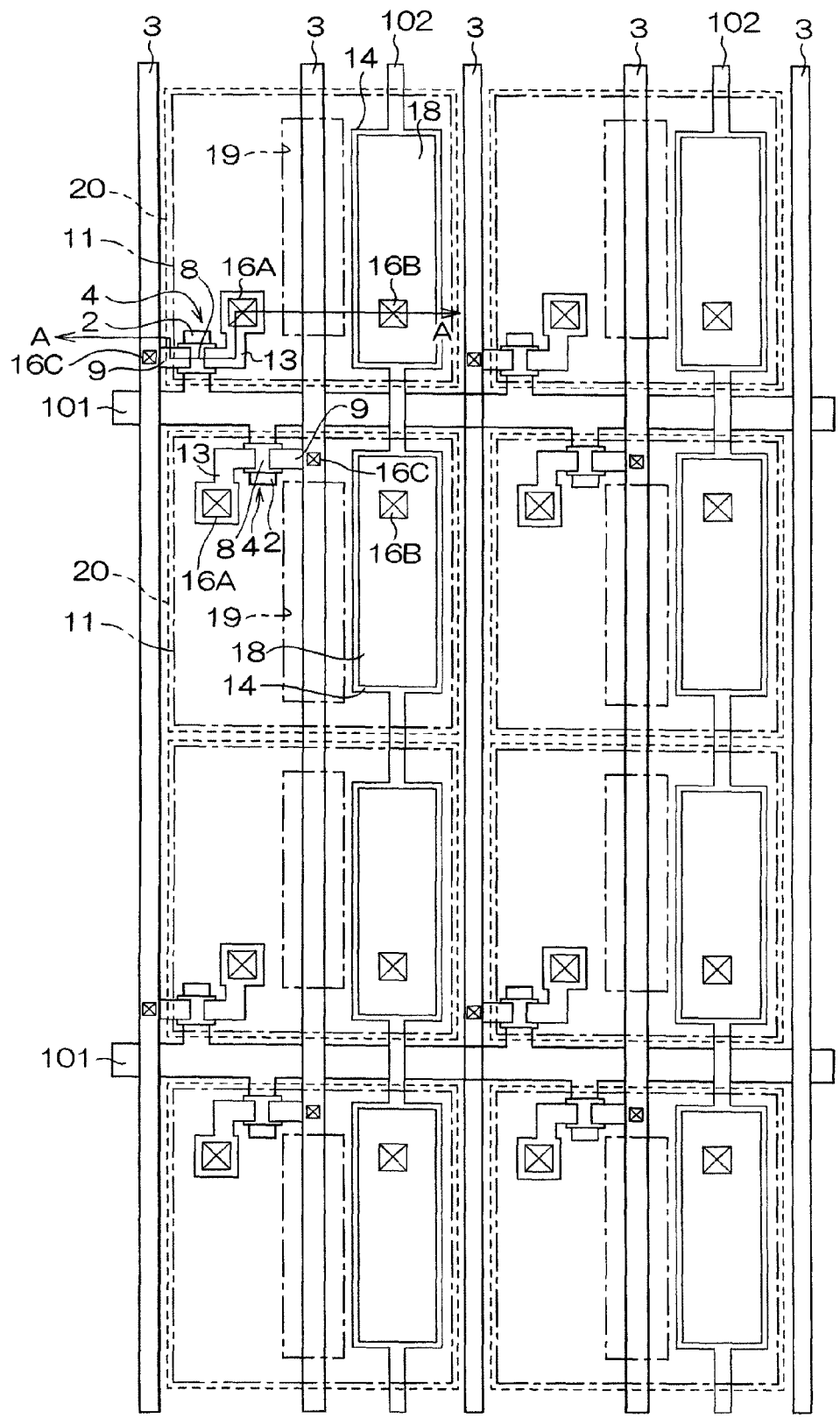
FIG. 5 is a plan view showing a configuration of an electromagnetic wave detection element according to a third exemplary embodiment.

FIG. 5 shows a plan view of a structure of an electromagnetic wave detection element 10 according to a third exemplary embodiment. Note that similar parts of the configuration to that of the first exemplary embodiment, are allocated with the same reference numerals and explanation thereof is omitted.

As shown in FIG. 5, the electromagnetic wave detection element 10 is provided with the storage capacitor lines 102 which are disposed alongside the signal lines 3, for each pixel line in the column direction of the matrix array.

Figure 6:
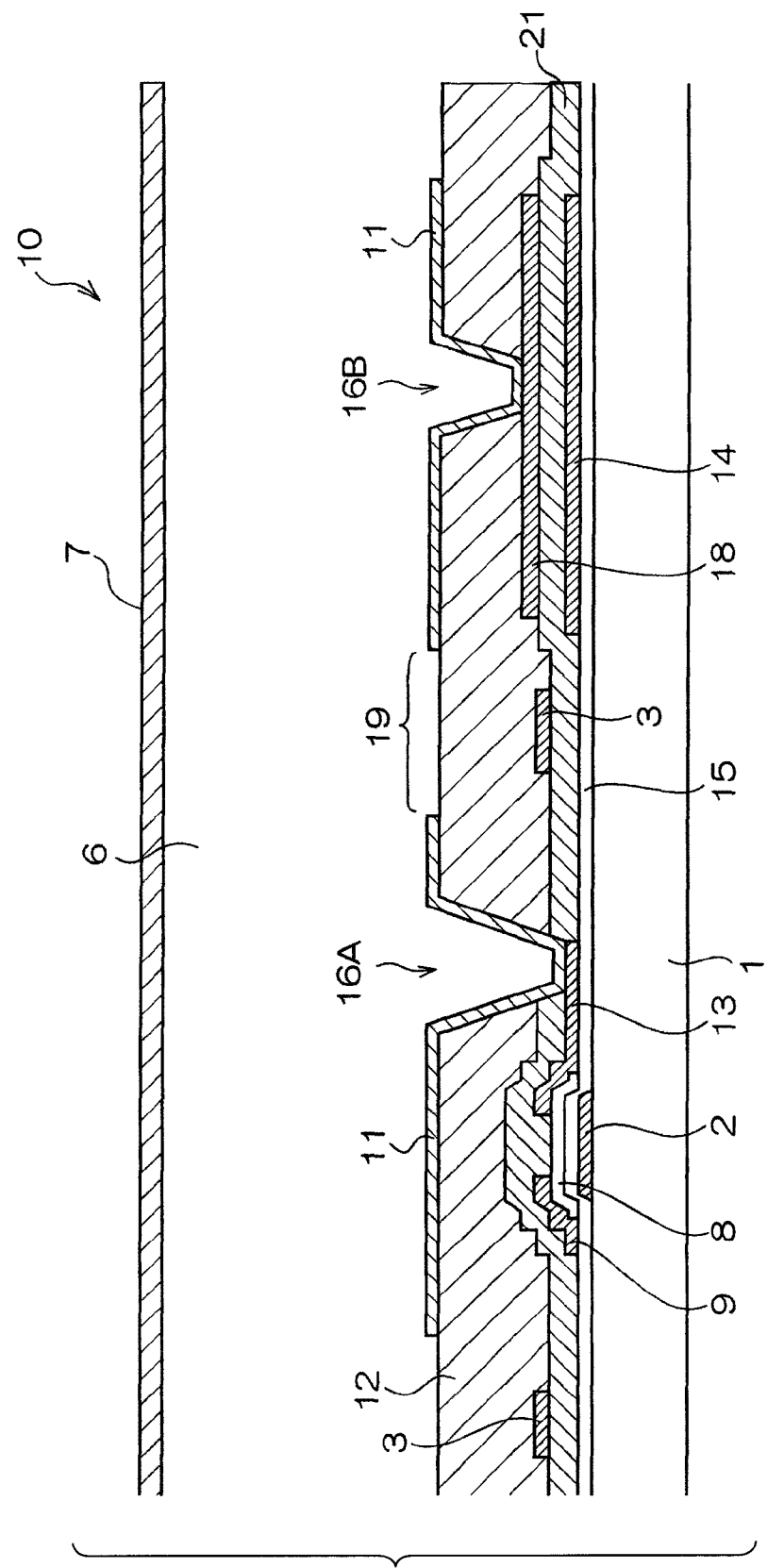
FIG. 6 is a cross-sectional view showing a configuration of an electromagnetic wave detection element according to the third exemplary embodiment.

A cross-sectional view along line A-A of FIG. 5 is shown in FIG. 6. Note that similar parts of the configuration to that of the first exemplary embodiment are allocated with the same reference numerals and explanation thereof is omitted.

In the electromagnetic wave detection element 10 according to the third exemplary embodiment, scan lines 101 (see FIG. 5) and gate electrodes 2 are formed on a substrate 1 as a first signal wiring layer. In the electromagnetic wave detection element 10 according to the third exemplary embodiment, an insulating film 15 is also formed on the first signal wiring layer. Further, source electrodes 9, drain electrodes 13, storage capacitor lower electrodes 14, and storage capacitor line 102 (see FIG. 5) are formed on the insulating film 15 as a second signal wiring layer.

Each of the storage capacitor lines 102 is connected, for each of the pixel lines in the column direction, to charge the storage capacitor lower electrodes 14 of the storage capacitors 5 that are provided to each of the pixels 20 of the pixel lines.

In the electromagnetic wave detection element 10 according to the third exemplary embodiment, an insulating film 21 is formed over substantially the entire region to which the pixels 20 are provided on the second signal wiring layer. In the electromagnetic wave detection element 10 according to the third exemplary embodiment, signal lines 3 are formed as a third signal wiring layer on the insulating film 21. In the electromagnetic wave detection element 10 according to the third exemplary embodiment, storage capacitor upper electrodes 18 are also formed on the insulating film 21 at positions corresponding to the storage capacitor lower electrodes 14.

Contact holes 16C (see FIG. 5) are also formed to the insulating film 21 at positions facing the signal lines 3 and the source electrodes 9. The signal lines 3 and the source electrodes 9 are electrically connected to each other through the contact holes 16C.

An interlayer insulating film 12 is formed over substantially the whole of the third signal wiring layer. Contact holes 16B are formed in the interlayer insulating film 12 at positions facing the storage capacitor upper electrodes 18. Further, contact holes 16A are also formed to the interlayer insulating film 12 and the insulating film 21 at positions facing the drain electrodes 13. The lower electrodes 11 that are formed on the interlayer insulating film 12 are connected to the drain electrodes 13 through contact holes 16A. The lower electrodes 11 are connected to the storage capacitor upper electrodes 18 through the contact holes 16B.

Consequently, according to the third exemplary embodiment, there are no intersections between the signal lines 3 and the storage capacitor lines 102, since the storage capacitor lines 102 are provided in the column direction. Therefore, the third exemplary embodiment can make the line capacitance of the signal lines 3 even smaller.

Fourth Exemplary Embodiment

Figure 7:
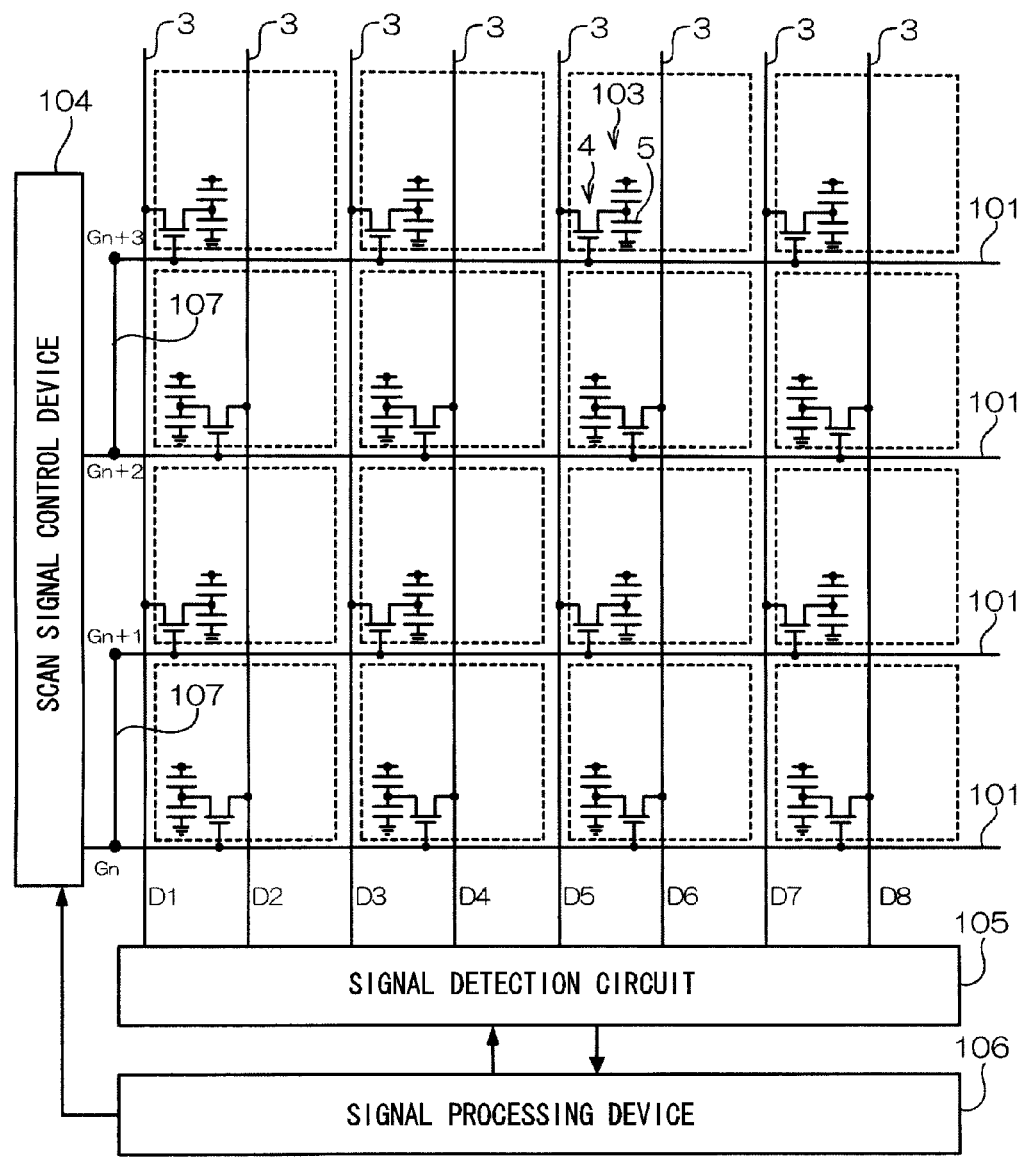
FIG. 7 is a schematic diagram showing an overall configuration of a radiographic imaging apparatus according to a fourth exemplary embodiment.

FIG. 7 shows an overall configuration of a radiographic imaging apparatus 100 according to a fourth exemplary embodiment. Note that similar parts of the configuration to that of the first exemplary embodiment, are allocated with the same reference numerals and explanation thereof is omitted.

As shown in FIG. 7, in an electromagnetic wave detection element 10, one scan line 101 is provided for each respective pixel line in the row direction (the across direction in FIG. 7) of the plural pixel 20 disposed in a matrix array.

Figure 8:
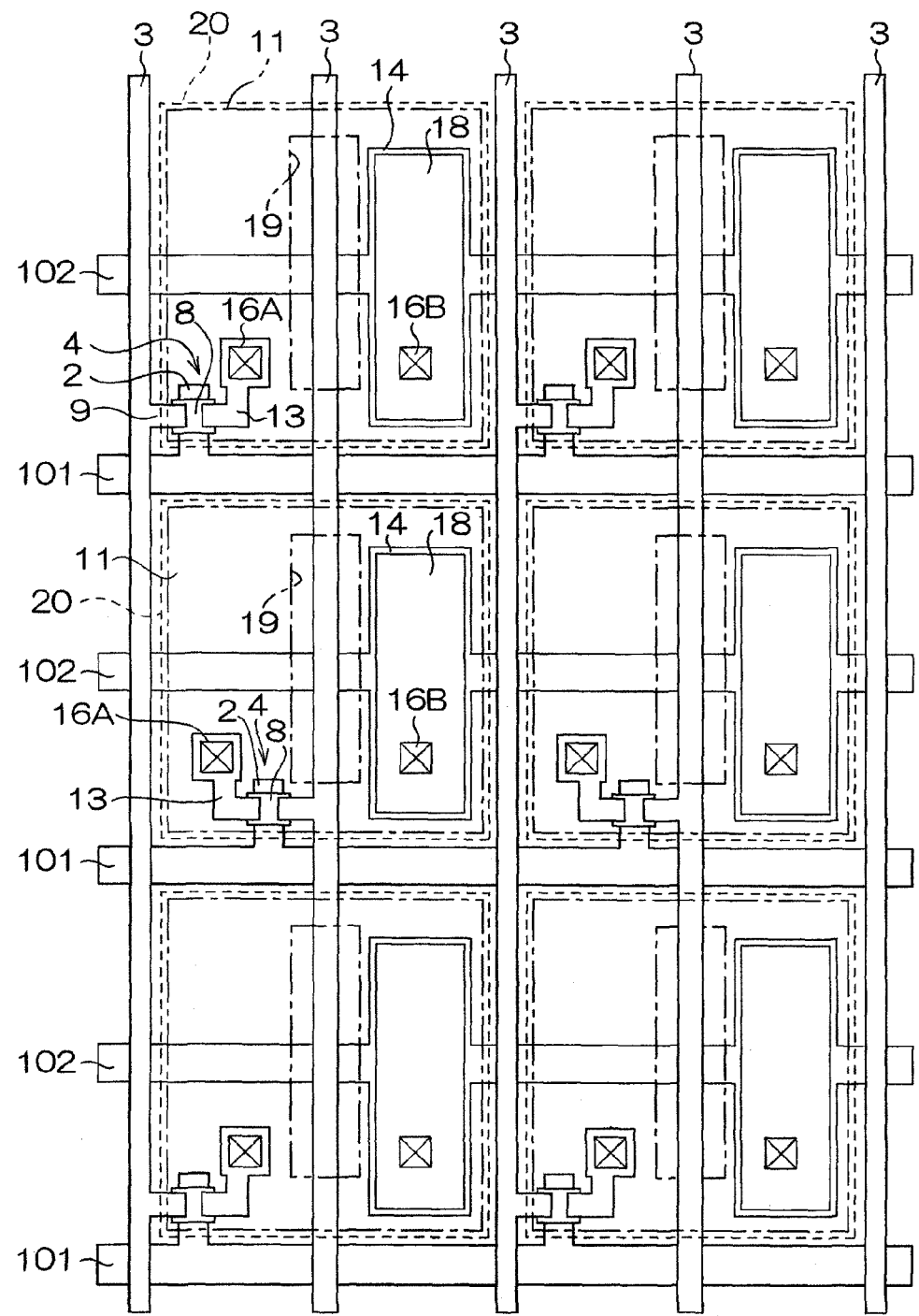
FIG. 8 is a plan view showing a configuration of a radiographic imaging apparatus according to a fourth exemplary embodiment.

FIG. 8 shows a plan view showing a structure of an electromagnetic wave detection element 10, according to the fourth exemplary embodiment. Note that similar parts of the configuration to that of the first exemplary embodiment are allocated with the same reference numerals and explanation thereof is omitted.

As shown in FIG. 8, in the electromagnetic wave detection element 10, each of the scan lines 101 is connected to each of the TFT switches 4 provided to each of the pixels 20 in each of the respective pixel lines, and the scan lines 101 switch the TFT switches 4.

As shown in FIG. 7, the electromagnetic wave detection element 10 is provided with connection lines 107 each electrically connected to two scan lines 101. One the pairs of scan lines 101 that have been connected by the connection line 107 is connected to a scan signal controller 104.

Consequently, when an ON signal is output from the scan signal controller 104 to the scan lines 101 in the electromagnetic wave detection element 10 according to the fourth exemplary embodiment, the ON signal flows through two of the scan lines 101.

During image read-out, the scan signal controller 104 outputs an ON signal in sequence to each of the scan lines 101. The ON signal is thereby supplied to the scan lines 101 at two lines at a time, and charge read-out is performed two pixel lines at a time.

In the fourth exemplary embodiment, the charge that has been accumulated in the charge storage capacitor 5 of each of the pixels 20 is read out two pixel lines at a time. In the fourth exemplary embodiment, the speed of read-out of the images is thereby raised in comparison to cases where read out is one pixel line at a time.

In each of the above exemplary embodiments, explanation has been given of cases where the scan lines 101 are disposed in the column direction of the plural pixels 20 that are disposed in a matrix array, and the signal lines 3 are disposed in the row direction. However, the present invention is not limited thereto. For example, the scan lines 101 may be disposed in the row direction and the signal lines 3 disposed in the column direction.

Figure 9:
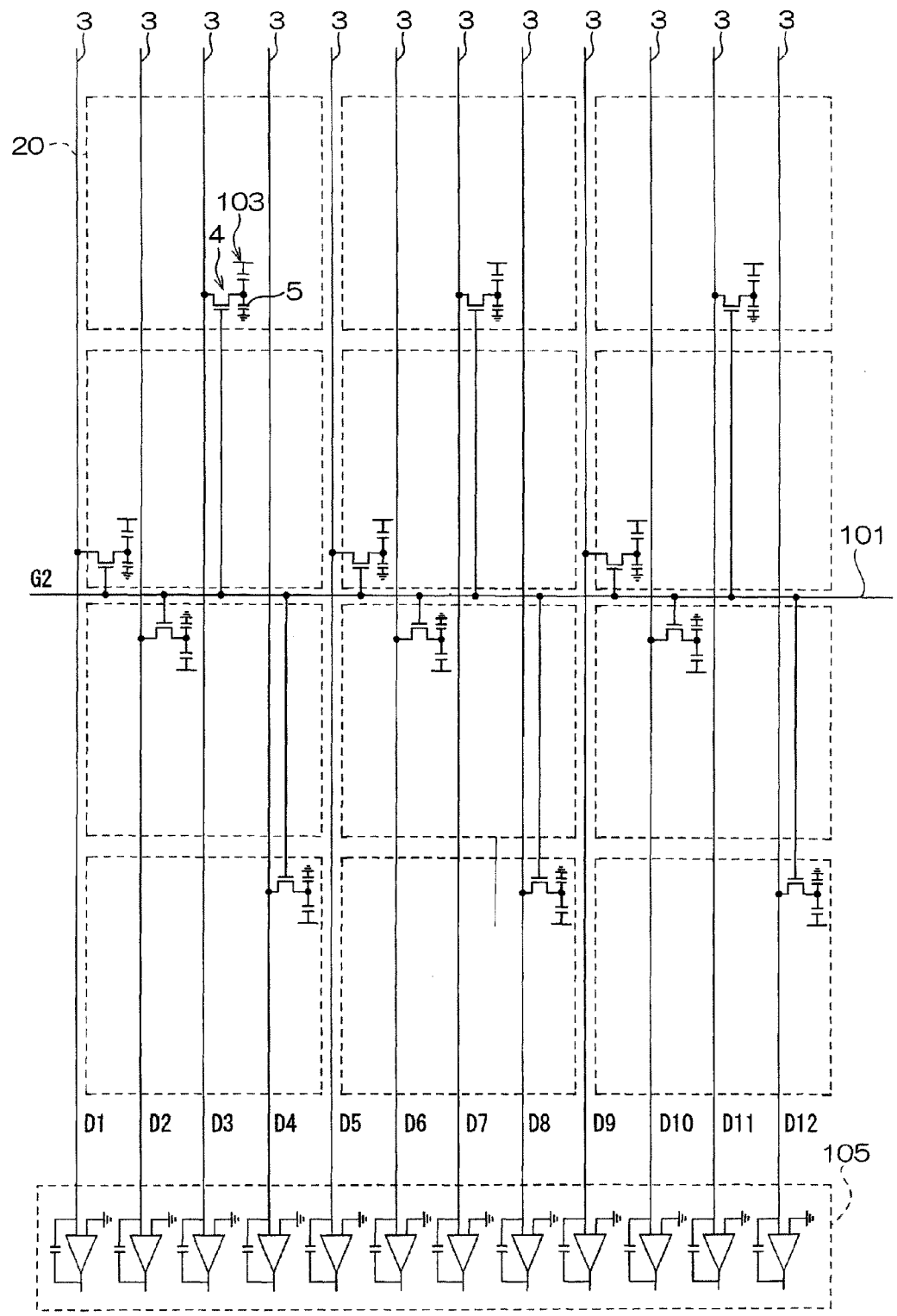
FIG. 9 is a configuration diagram showing another configuration of an electromagnetic wave detection element according to the first to the third exemplary embodiments.
Figure 10:
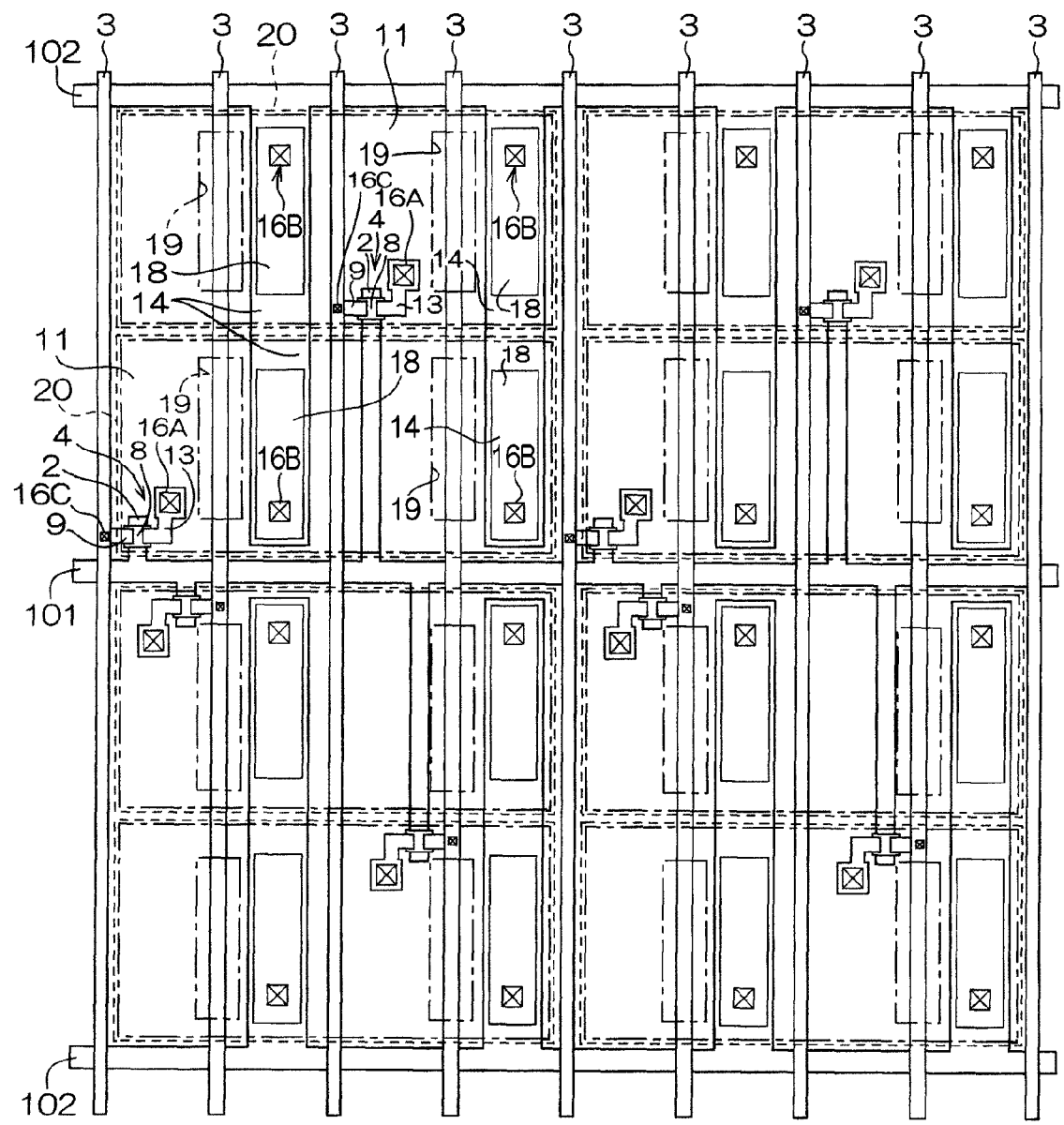
FIG. 10 is a plan view showing another configuration of an electromagnetic wave detection element according to the first to the third exemplary embodiments.

Furthermore, in the above first to third exemplary embodiments, explanation has been given of cases in which one scan line 101 is provided for each two pixel lines in the row direction, and two signal lines 3 are provided for each of the respective pixel lines in the column direction. However, the present invention is not limited thereto. For example, one of the scan lines 101 may be disposed for each N pixel lines (where N is an integer of 2 or more) in the row direction, and N signal lines 3 may be disposed for each pixel line in the column direction. When one of the scan lines 101 is provided for 3 or more of the pixel lines on the row direction, the layer configuration of the electromagnetic wave detection element 10 may be, for example, like the layer configuration of the third exemplary embodiment, with wiring formed in the first signal wiring layer with the scan lines 101 and each of the gate electrodes 2 connected. FIG. 9 shows an electromagnetic wave detection element 10 where one scan line 101 is disposed for each four pixel lines in the row direction, and four signal lines 3 are disposed for each pixel line in the column direction. FIG. 10 shows a plan view of a structure of the electromagnetic wave detection element 10 shown in FIG. 9.

Also, explanation has been given in the above fourth exemplary embodiment of a case in which one of the scan lines 101 is disposed for each of the pixel lines in the row direction, and the scan lines 101 are electrically connected together in pairs by the connection lines 107. However, the present invention is not limited thereto. For example, the scan lines 101 may be electrically connected together in groups of N lines by the connection lines 107.

Figure 11:
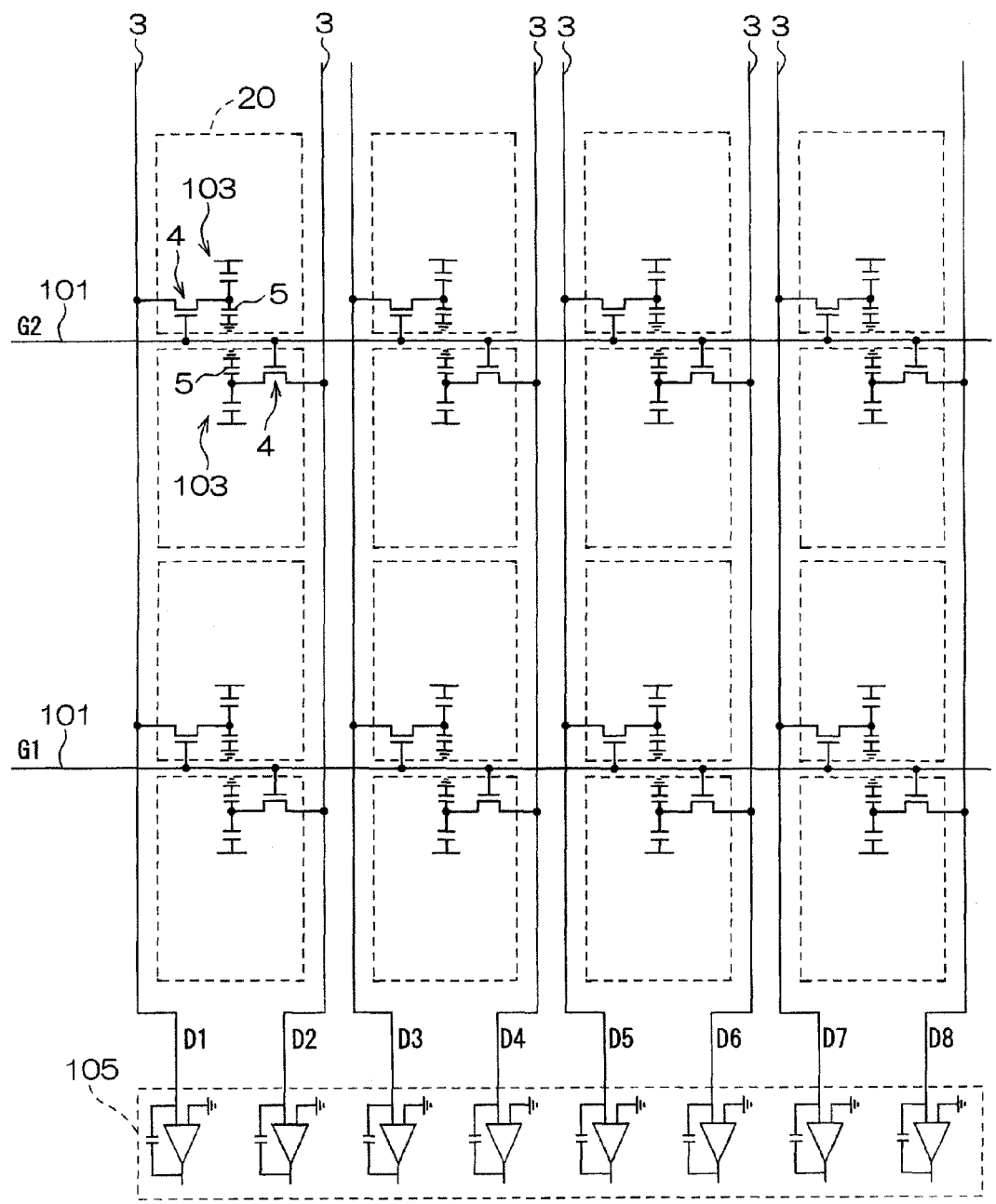
FIG. 11 is a configuration diagram showing another configuration of an electromagnetic wave detection element according to the first exemplary embodiment.
Figure 12:
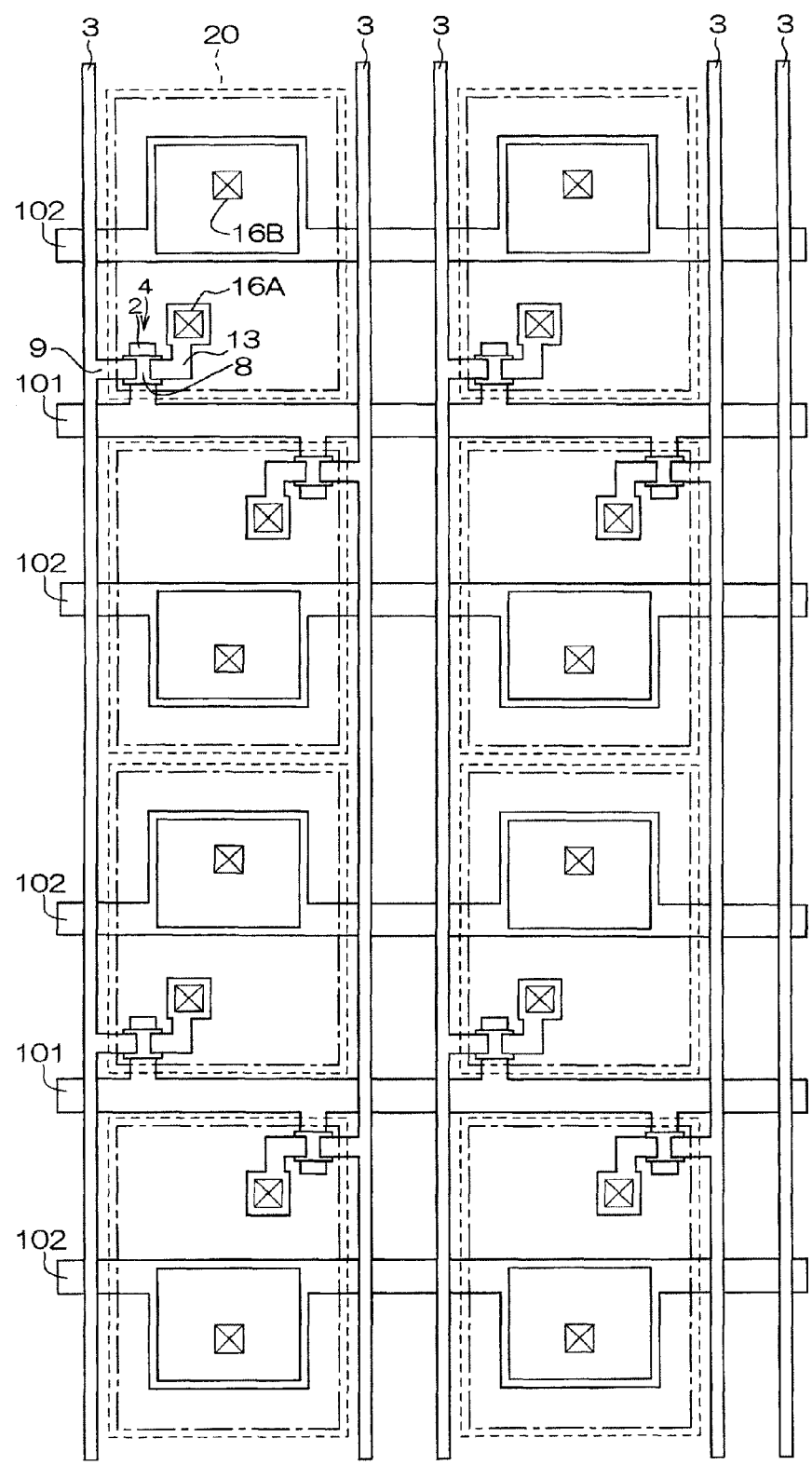
FIG. 12 is a plan view showing another configuration of an electromagnetic wave detection element according to the first exemplary embodiment.
Figure 13:
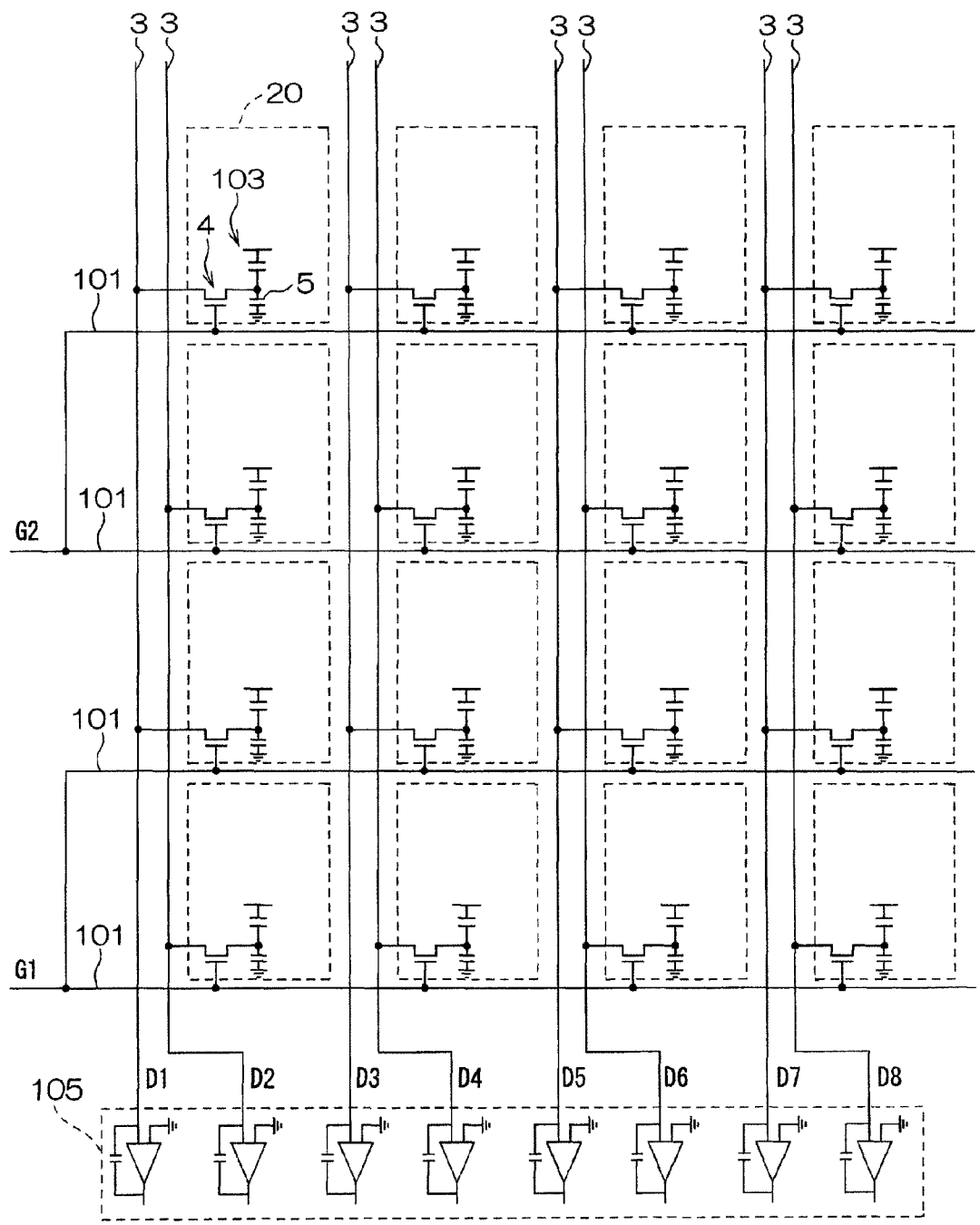
FIG. 13 is a configuration diagram showing another configuration of an electromagnetic wave detection element according to the fourth exemplary embodiment.

Explanation has been given in the above fourth exemplary embodiment of a case in which the signal lines 3 are disposed with an even spacing therebetween. However, the present invention is not limited thereto. For example, the signal lines 3 for each of the pixel lines may be disposed unevenly alongside the pixels 20 of each of the pixel lines. FIG. 11 shows a configuration like the above first exemplary embodiment, shown with an electromagnetic wave detection element 10 in which the signal lines 3 are disposed unevenly alongside the pixels pixel 20. FIG. 12 shows a plan view showing a structure of the electromagnetic wave detection element 10 shown in FIG. 11. FIG. 13 also shows an electromagnetic wave detection element 10, in a configuration like that of the fourth exemplary embodiment, in which the signal lines 3 have been disposed unevenly alongside the pixels 20.

Figure 14:
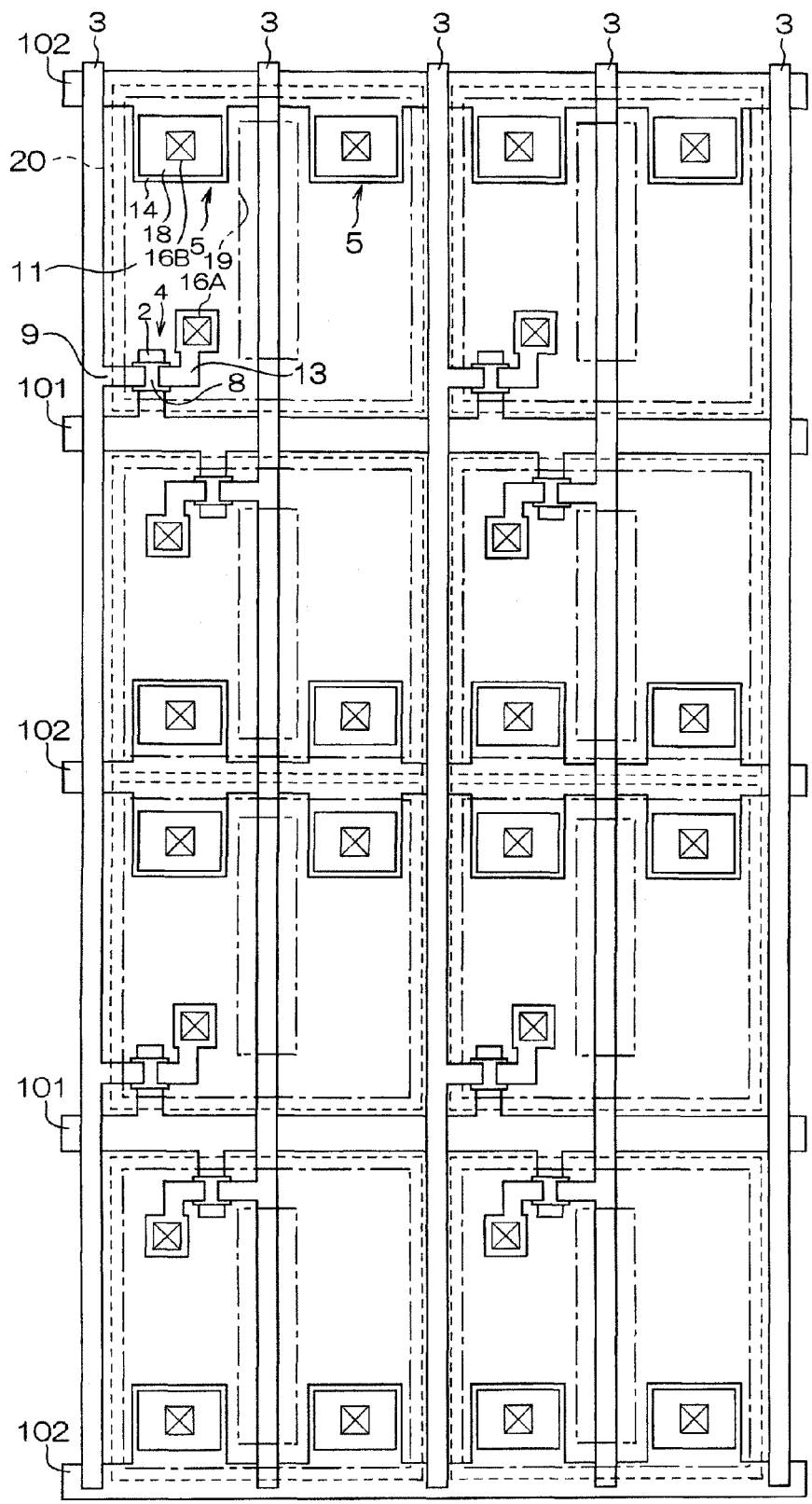
FIG. 14 is a plan view showing another configuration of an electromagnetic wave detection element according to the third exemplary embodiment.

Explanation has been given in each of the above exemplary embodiments of cases in which, for each of the pixel lines in the column direction, the TFT switch 4 and the charge storage capacitor 5 are provided in the same region for each of the pixels 20. However, the present invention is not limited thereto. For example, in each of the pixel lines in the column direction, the region where the TFT switch 4 is provided and the region where the charge storage capacitor 5 is provided in each of the pixels 20 may alternate. Plural of the charge storage capacitors 5 may also be provided in plural regions for each of the pixels 20. FIG. 14 shows a configuration of the second exemplary embodiment in which two charge storage capacitors 5 are provided in respective regions for each of the pixels 20.

Explanation has been given in the above first to third exemplary embodiments of cases in which the TFT switches 4 of two pixels in the column direction are alternately connected in sequence above and below to the respective signal lines 3. However, the present invention is not limited thereto. For example, the connection sequence may be changed for each of the pixels in the column direction to above-below then below-above.

Explanation has been given in the above exemplary embodiments of cases in which plural of the pixels 20 are provided in a matrix on the image receiving face as a single pixel area. However, for example, a configuration may be adopted for the present invention in which the image receiving face is divided into plural pixel areas, as in Document 1, with each of the pixel areas configured as in the above exemplary embodiments. In such cases the electromagnetic wave detection element 10 is able to capture video images with an even higher frame rate, by performing read-out of the image by each of the pixel areas.

Explanation has been given in the above exemplary embodiments of cases in which the present invention is applied to the radiographic imaging apparatus 100 that detects images by detecting X-rays as the electromagnetic waves for detection. However, the present invention is not limited thereto. The electromagnetic waves that are the object of detection may be, for example, visible light, ultraviolet rays, infrared rays, or the like.

Explanation has been given in the above exemplary embodiments of cases in which the present invention is applied to a direct-conversion-type electromagnetic wave detection element 10 that directly converts radiation into charge in a semiconductor layer and accumulates the charge. However, the present invention is not limited thereto. For example, an indirect-conversion-type electromagnetic wave detection element that first convert radiation into light with a scintillator, then converts the converted light into charge in a semiconductor layer, and accumulates the charge, may be employed.

Explanation has been given in the above exemplary embodiments of cases in which the electromagnetic wave detection element 10 has the charge storage capacitor 5 provided to each of the pixels 20. However, the present invention is not limited thereto. For example, if the lower electrode 11 has sufficient capacity to accumulate charges, then configuration may be made without forming the charge storage capacitor 5 to each of the pixels 20.

In the explanations of the above exemplary embodiments, the configurations of the radiographic imaging apparatus 100 (see FIG. 1 and FIG. 7) and the electromagnetic wave detection element 10 (see FIG. 2 to FIG. 6, and FIG. 8 to FIG. 14) are only examples. Obviously appropriate modifications and variations may be made thereto within a scope that does not depart from the spirit of the present invention.

What is claimed is:

1. An electromagnetic wave detection element comprising:
   a plurality of pixels disposed in a matrix, along a first direction and a second direction intersecting with the first direction, each pixel accumulating charges generated by irradiation of electromagnetic waves, and each pixel having a switching element for reading out the accumulated charges;
   scan lines that switch each of the switching elements, each scan line being disposed corresponding to a plurality of pixel lines in the first direction, and connected to each of the switching elements provided to the respective pixels in the plurality of pixel lines; and
   a plurality of signal lines, of which at least two signal lines correspond to and form a group for each pixel line in the second direction, wherein the groups of signal lines are disposed with an even spacing therebetween,
   wherein each switching element, among switching elements connected to a particular scan line, is connected to a different signal line than each other switching element connected to the particular scan line,
   wherein charge accumulated in the pixels flows through the signal lines according to the switching state of each of the switching elements, and
   wherein the scan lines are provided such that one scan line is provided for each two pixel lines in the first direction, disposed between the two respective pixel lines, and each of the switching elements is provided at the scan line side of the corresponding pixel.

2. The electromagnetic wave detection element of claim 1, wherein two of the signal lines are provided for each pixel line in the second direction, with one of the two signal lines disposed so as to pass through a central region of the pixels of the pixel line.

3. The electromagnetic wave detection element of claim 1, wherein
   the pixels are further provided with a collecting electrode that collects the generated charges; and
   the collecting electrode is provided with a slit at a position where the signal line is disposed.

4. The electromagnetic wave detection element of claim 3, wherein:
   the pixels are further provided with a charge accumulation portion that accumulates the collected charges; and
   the charge accumulation portion and the switching element are electrically connected via the collecting electrode.

5. The electromagnetic wave detection element of claim 4, wherein the charge accumulation portion is configured with two facing electrodes, further including accumulation capacitor lines, each disposed to a plurality of pixel lines in the first direction, each connected to one of the electrodes of the charge accumulation portion provided to each of the pixels of the plurality of pixel lines.

6. The electromagnetic wave detection element of claim 4, wherein the charge accumulation portion is configured with two facing electrodes, further including accumulation capacitor lines, each disposed corresponding to each of the pixel lines in the second direction alongside the signal lines, and each connected to one of the electrodes of the charge accumulation portion provided to each of the pixels in each of the pixel lines in the second direction.

7. The electromagnetic wave detection element of claim 5, wherein the signal lines and the accumulation capacitor lines are formed in different wiring layers.

8. An electromagnetic wave detection element comprising:
   a plurality of pixels disposed in a matrix, along a first direction and a second direction intersecting with the first direction, each pixel accumulating charges generated by irradiation of electromagnetic waves, and each pixel having a switching element for reading out the accumulated charges;

scan lines that switch each of the switching elements, one scan line being disposed corresponding to each pixel line in the first direction, the scan lines being connected to each of the switching elements provided to each pixel in the corresponding pixel line;

connection lines, each electrically connecting a specific number of the scan lines; and a plurality of signal lines, of which at least two signal lines correspond to and form a group for each pixel line in the second direction, wherein the groups of signal lines are disposed with an even spacing therebetween, wherein each switching element, among switching elements connected to the scan lines electrically connected by a particular connection line, is connected to a different signal line than each other switching element connected to the scan lines electrically connected by the particular connection line, wherein charge accumulated in the pixels flows through the signal lines according to the switching state of each of the switching elements, and wherein the pixels are further provided with a collecting electrode that collects the generated charges, and the collecting electrode is provided with a slit at a position where the signal line is disposed.

9. The electromagnetic wave detection element of claim 8, wherein two of the signal lines are provided for each pixel line in the second direction, with one of the two signal lines disposed so as to pass through a central region of the pixels of the pixel line.

10. The electromagnetic wave detection element of claim 8, wherein:
the pixels are further provided with a charge accumulation portion that accumulates the collected charges; and
the charge accumulation portion and the switching element are electrically connected via the collecting electrode.

11. The electromagnetic wave detection element of claim 10, wherein the charge accumulation portion is configured with two facing electrodes, further including accumulation capacitor lines, each disposed corresponding to each of a plurality of pixel lines in the first direction, each connected to one of the electrodes of the charge accumulation portion provided to each of the pixels of the plurality of pixel lines.

12. The electromagnetic wave detection element of claim 10, wherein
the charge accumulation portion is configured with two facing electrodes; and
accumulation capacitor lines are further provided with one accumulation capacitor line for each pixel line in the second direction of the matrix array disposed alongside the signal lines, and for each of the pixel lines in the second direction, the respective accumulation capacitor line is connected to one of the electrodes of the charge accumulation portion provided to each of the pixels in each of the pixel lines.

13. The electromagnetic wave detection element of claim 11, wherein the signal lines and the accumulation capacitor lines are formed in different wiring layers.

* * * * *